(12) United States Patent
Sasao et al.

(10) Patent No.: US 12,424,433 B2
(45) Date of Patent: Sep. 23, 2025

(54) METHOD FOR MANUFACTURING METAL FLUORIDE-CONTAINING ORGANIC POLYMER FILM, PATTERNING METHOD, AND METHOD FOR MANUFACTURING SEMICONDUCTOR DEVICE

(71) Applicant: Kioxia Corporation, Tokyo (JP)

(72) Inventors: Norikatsu Sasao, Kanagawa (JP); Koji Asakawa, Kanagawa (JP); Shinobu Sugimura, Kanagawa (JP); Ryosuke Yamamoto, Aichi (JP)

(73) Assignee: KIOXIA CORPORATION, Tokyo (JP)

( * ) Notice: Subject to any disclaimer, the term of this patent is extended or adjusted under 35 U.S.C. 154(b) by 807 days.

(21) Appl. No.: 17/682,768

(22) Filed: Feb. 28, 2022

(65) Prior Publication Data

US 2023/0089206 A1 Mar. 23, 2023

(30) Foreign Application Priority Data

Sep. 21, 2021 (JP) ................. 2021-153426

(51) Int. Cl.
*H01L 21/02* (2006.01)
*H01L 21/311* (2006.01)

(52) U.S. Cl.
CPC .... *H01L 21/0212* (2013.01); *H01L 21/02178* (2013.01); *H01L 21/02181* (2013.01); *H01L 21/02183* (2013.01); *H01L 21/02186* (2013.01); *H01L 21/02192* (2013.01); *H01L 21/02194* (2013.01); *H01L 21/31138* (2013.01); *H01L 21/31144* (2013.01)

(58) Field of Classification Search
None
See application file for complete search history.

(56) References Cited

U.S. PATENT DOCUMENTS

| 9,487,600 B2 | 11/2016 | Darling et al. |
| 10,381,227 B2 | 8/2019 | George et al. |
| | (Continued) | |

FOREIGN PATENT DOCUMENTS

JP 2019-023251 A 2/2019

OTHER PUBLICATIONS

Barick et al., "Tin oxide nanostructure fabrication via sequential infiltration synthesis in block copolymer thin films," Department of Chemical Engineering, Technion, Haifa, Israel, Journal of Colloid and Interface Science, 557 (2019), pp. 537-545; URL:https://doi.org/10.1016/j.jcis.2019.09.044; 9 pages.

(Continued)

*Primary Examiner* — Sue A Purvis
*Assistant Examiner* — Carnell Hunter, III
(74) *Attorney, Agent, or Firm* — Foley & Lardner LLP

(57) ABSTRACT

A method for manufacturing a metal fluoride-containing organic polymer film includes forming an organic polymer film on a base body. The method includes exposing the organic polymer film to an organometallic compound containing a first metal, thereby infiltrating the organic polymer film with the organometallic compound. The method includes exposing the organic polymer film infiltrated with the organometallic compound to hydrogen fluoride, thereby providing a fluoride of the first metal in the organic polymer film.

14 Claims, 6 Drawing Sheets

(56) References Cited

U.S. PATENT DOCUMENTS

| | | | |
|---|---|---|---|
| 10,672,621 | B2 | 6/2020 | Sasao et al. |
| 2017/0365478 | A1 | 12/2017 | George et al. |
| 2019/0027369 | A1 | 1/2019 | Kori et al. |
| 2019/0340316 | A1 | 11/2019 | Lill et al. |
| 2020/0006076 | A1 | 1/2020 | Sasao et al. |
| 2020/0133132 | A1* | 4/2020 | Ouyang .............. H01L 23/5283 |
| 2020/0291155 | A1 | 9/2020 | Sasao et al. |
| 2020/0294795 | A1* | 9/2020 | Sasao ................ H01L 21/31116 |
| 2020/0381641 | A1 | 12/2020 | Visvanathan et al. |
| 2021/0070898 | A1 | 3/2021 | Sasao et al. |

OTHER PUBLICATIONS

Lee et al., "Atomic Layer Deposition of AlF3 Using Trimethylaluminum and Hydrogen Fluoride," Department of Chemistry and Biochemistry and Department of Mechanical Engineering, University of Colorado at Boulder, Boulder, CO, USA, American Chemical Society, ACS Publications, The Journal of Physical Chemistry, 2015, 119, pp. 14185-14194; URL:http://dx.doi.org/10.1021/acs.jpcc.5b02625; 10 pages.

Peng et al., "A Route to Nanoscopic Materials via Sequential Infiltration Synthesis on Block Copolymer Templates," Energy Systems Division and Center for Nanoscale Materials, Argonne National Laboratory, 9700 S. Cass Avenue, Argonne, Illinois 60439, United States, ACS Nano, vol. 5, No. 6, 2011, pp. 4600-4606; 7 pages.

* cited by examiner

METHOD FOR MANUFACTURING METAL FLUORIDE-CONTAINING ORGANIC POLYMER FILM, PATTERNING METHOD, AND METHOD FOR MANUFACTURING SEMICONDUCTOR DEVICE

CROSS-REFERENCE TO RELATED APPLICATION(S)

This application is based upon and claims the benefit of priority from Japanese Patent Application No. 2021-153426, filed Sep. 21, 2021, the entire contents of which are incorporated herein by reference.

FIELD

Embodiments described herein relate generally to a method for manufacturing a metal fluoride-containing organic polymer film, a patterning method, and a method for manufacturing a semiconductor device.

BACKGROUND

The development of a semiconductor device with a three-dimensional structure has proceeded. In such a three-dimensional structure, a technique for forming a pattern with a high aspect ratio has been increasingly desired. Since a mask pattern used in a process for the technique is exposed to an etching gas for an extended period, the mask pattern is typically desired to have a certain level of resistance to the etching gas. For example, when a fluorocarbon gas is used as the etching gas, high etch resistance to a fluoride radical or a radical containing fluorine, and a fluoride ion or an ion containing fluorine is required for the mask pattern, and an increase in etch rate of a substance to be processed is also desired.

DETAILED DESCRIPTION

Embodiments provide a method for manufacturing a metal fluoride-containing organic polymer film used for an etch mask and the like, a patterning method capable of achieving high etch resistance and increasing an etch rate, and a method for manufacturing a semiconductor device.

In general, according to one embodiment, a method for manufacturing a metal fluoride-containing organic polymer film includes forming an organic polymer film on a base body. The method includes exposing the organic polymer film to an organometallic compound containing a first metal, thereby infiltrating the organic polymer film with the organometallic compound. The method includes exposing the organic polymer film infiltrated with the organometallic compound to hydrogen fluoride, thereby providing a fluoride of the first metal in the organic polymer film.

Hereinafter, a method for manufacturing a metal fluoride-containing composite film, a patterning method, and a method for manufacturing a semiconductor device of embodiments will be described with reference to the drawings. In each embodiment, substantially the same elements are denoted by the same reference symbols, and description thereof may be partially omitted. The drawings are schematic, and relationships between thicknesses and plane dimensions, ratios of thicknesses of portions, and the like may differ from the actual relationships and ratios.

Figure 1A:
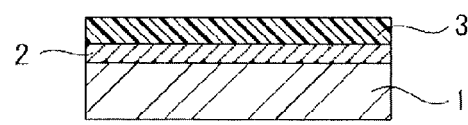
FIGS. 1A to 1F are views illustrating steps of a patterning method of an embodiment.

Method for Manufacturing Metal Fluoride-Containing Composite Film and Patterning Method A method for manufacturing a metal fluoride-containing organic polymer film and a patterning method of an embodiment will be described with reference to FIGS. 1A to 1F, 2A to 2D, 3A to 3E, and 4A to 4E. FIGS. 1A to 1F are cross-sectional views illustrating steps of the patterning method of the embodiment. In the patterning method illustrated in FIGS. 1A to 1F, a film 2 to be processed that is formed on a substrate 1 is prepared, and an etch mask 3 is formed on the film 2 to be processed, as illustrated in FIG. 1A. The etch mask 3 is a metal fluoride-containing organic polymer film manufactured by the method for manufacturing a metal fluoride-containing organic polymer film of the embodiment. The film 2 to be processed is not particularly limited, and for example, various types of function films used in a step of manufacturing a semiconductor device are used.

Figure 2A:
FIGS. 2A to 2D are views illustrating a first example of steps of forming a metal fluoride-containing organic polymer film of the embodiment.
Figure 2B:
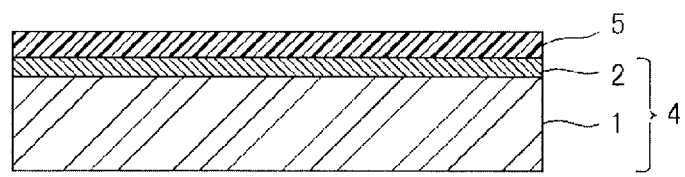

A first example of steps of manufacturing the metal fluoride-containing organic polymer film as the etch mask 3 will be described in detail with reference to FIGS. 2A to 2D. As illustrated in FIG. 2A, the substrate 1 having the film 2 to be processed is prepared as a base body 4. Herein, on the assumption that the metal fluoride-containing organic polymer film is used for a patterning method used in the step of manufacturing a semiconductor device and the like, the substrate 1 having the film 2 to be processed is used as the base body 4. However, when the metal fluoride-containing organic polymer film is used for another application, the base body 4 is appropriately selected. For example, a semiconductor wafer such as a silicon substrate is considered as the substrate 1. As illustrated in FIG. 2B, an organic polymer film 5 is formed on the base body 4. In order to form an organic polymer film that is infiltrated with a metal by exposure to an organometallic compound that is a precursor of the infiltrating metal, the organic polymer film 5 is used. Herein, the infiltration of the organic polymer film 5 with the metal by exposure of the organic polymer film 5 to the organometallic compound is called metallizing.

As the organic polymer film 5 to be metallized, a spin-on carbon (SOC) film or the like is used. For the SOC film, for example, an organic polymer containing a monomer having an ester group (—C(=O)—R$^1$), an amido group (—C(=O)—NR$^1$R$^2$), an imido group (—C(=O)—NR$^1$—C(=O)—R$^2$), or the like is used. In the formulae, R$^1$ and R$^2$ are the same as or different from each other, and are a hydrogen atom (—H), an alkyl group having about 1 to 5 carbon atoms (—C$_n$H$_{2n+1}$ wherein n is an integer of 1 to 5), or the like. The aforementioned characteristic group binds to the organometallic compound that is a precursor of the metal, to promote the infiltration of the organic polymer with the metal. That is, molecules of the organometallic compound adsorb to a carbonyl group (—C(=O)—), an amino group (—NR$^1$R$^2$), or the like in the characteristic group, to form a structure in which the organometallic compound adsorbs to an oxygen atom or a nitrogen atom in the organic polymer film 5. Examples of the organic polymer having the aforementioned characteristic group include polymethyl methacrylate (PMMA), poly(N-isopropylacrylamide) (PNIPAM), and a polystyrene derivative having the characteristic group and an aromatic ring on a side chain.

Figure 2C:
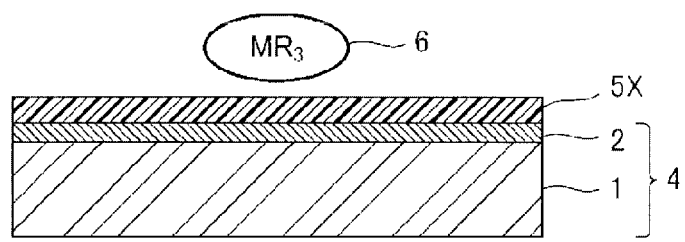

As illustrated in FIG. 2C, the organic polymer film 5 is then exposed to an organometallic compound 6 that is a precursor of a metal M (first metal) for infiltration, to infiltrate the organic polymer film 5 with the organometallic compound 6. Examples of the metal M used for metallizing include at least one selected from the group consisting of boron (B), aluminum (Al), lanthanum (La), thorium (Th), hafnium (Hf), titanium (Ti), zirconium (Zr), scandium (Sc), gadolinium (Gd), gallium (Ga), cerium (Ce), praseodymium (Pr), yttrium (Y), lithium (Li), silicon (Si), beryllium (Be), tantalum (Ta), vanadium (V), niobium (Nb), samarium (Sm), erbium (Er), terbium (Tb), neodymium (Nd), europium (Eu), holmium (Ho), strontium (Sr), plutonium (Pu), dysprosium (Dy), calcium (Ca), chromium (Cr), germanium (Ge), cesium (Cs), indium (In), carbon (C), rubidium (Rb), potassium (K), sodium (Na), tin (Sn), molybdenum (Mo), magnesium (Mg), iron (Fe), manganese (Mn), nickel (Ni), antimony (Sb), cobalt (Co), neptunium (Np), copper (Cu), silver (Ag), gold (Au), platinum (Pt), arsenic (As), phosphorus (P), lutetium (Lu), bromine (Br), iodine (I), and ruthenium (Ru). Examples of the organometallic compound having such a metal M include alkyl metals (M(C$_n$H$_{2n+1}$)$_x$ wherein n is an integer of 1 to 4, and x is an integer determined according to the metal M, for example, an integer of 1 to 5) typified by trimethyl metal (M(CH$_3$)$_3$).

Figure 2D:
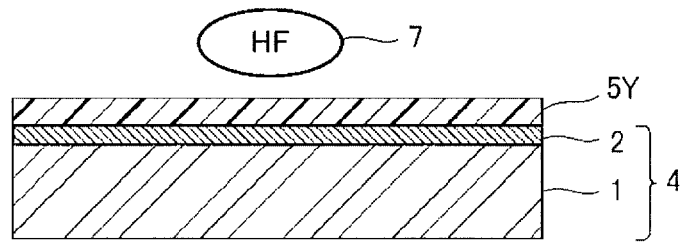

When the organic polymer film 5 is exposed to the organometallic compound 6 containing the metal M as described above, the organic polymer film 5 is infiltrated with the organometallic compound 6, to form an organic polymer film 5X containing the organometallic compound 6. As illustrated in FIG. 2D, the organic polymer film 5X that is infiltrated with the organometallic compound 6 such as MR$_3$ is exposed to hydrogen fluoride (HF) 7. In the exposure to the HF 7, gas or liquid HF may be used. It is preferable that gas HF be used. When M(CH$_3$)$_3$ or the like present in the organic polymer film 5X reacts with HF in an atmosphere during the exposure, a metal fluoride (MF$_x$) is produced according to the following formula (1).

$$M(CH_3)_3 + 3HF \rightarrow MF_3 + 3CH_4 \quad (1)$$

When the organic polymer film 5X is thus exposure to the hydrogen fluoride (HF) 7, an organic polymer film 5Y containing the metal fluoride (MF$_x$) is formed. The metal fluoride present in the organic polymer film 5Y contributes to improvement in etch resistance of the organic polymer film 5Y. Therefore, the use of the organic polymer film 5Y as the etch mask 3 can enhance the etch resistance of the etch mask 3 as described in detail below. The metal fluoride (MF$_x$) present in the organic polymer film 5Y can be analyzed, for example, by X-ray photoelectron spectroscopy (XPS) or energy-dispersive X-ray (EDX) analysis of a cross section of the organic polymer film 5Y.

When the organic polymer film 5 is exposed to the organometallic compound 6, it is preferable that the inside of a process chamber where the organic polymer film 5 is placed be kept in a vacuum state of 1 kPa or less, and the organometallic compound 6 be then introduced into the process chamber at a pressure of 5 kPa or less, resulting in infiltration. Further, it is preferable that the HF 7 be introduced into the process chamber at a pressure of 5 kPa or less, resulting in fluorination of the organic polymer film 5 exposed to the organometallic compound 6. Specifically, a HF gas is supplied to the process chamber. By the exposure to the organometallic compound 6 and the HF 7 under such conditions, the infiltration of the organic polymer film 5 with the organometallic compound 6 and the fluorination of the organometallic compound 6 can be efficiently achieved. That is, the organic polymer film 5 can be infiltrated with the organometallic compound 6, and the organometallic compound 6 can be efficiently fluorinated.

As a post-treatment of M(CH$_3$)$_3$ and the like formed by metallizing the organic polymer film 5, the oxidation of M(CH$_3$)$_3$ and the like to form a metal oxide (MO$_x$) in the organic polymer film 5 is known. However, the metal oxide (MO$_x$) has insufficient resistance to a CF-based gas as described below although the metal oxide has excellent resistance to an oxygen-based gas containing an oxygen radical and the like that is used in reactive ion etching (RIE). On the contrary, the metal fluoride (MF$_x$) has excellent resistance to a CF-based gas as described in detail below. For example, when as the metal M, aluminum (Al) is used, the binding energy between Al and oxygen (O) is 501.9 kJ/mol, and the binding energy between Al and fluorine (F) is 675 kJ/mol. Therefore, the fluoride of Al is more stable than the oxide of Al, and the fluoride (AlF$_3$) tends to be formed. AlF$_3$ has a boiling point as high as 1,276° C., and is resistant to chemical etching. When the organic polymer film 5Y containing the metal fluoride (MF$_x$) is used as the etch mask 3, the resistance to etching using a CF-based gas containing a F ion or radical can be enhanced.

Next, the metal M involved in the organometallic compound 6 that is a precursor will be described in detail. In order to express RIE resistance of the etch mask 3, the use as an etch mask in RIE of a metallic compound-containing resin that is obtained by infiltrating an organic polymer (resin) with an organometallic compound is effective. To processing of a silicon-based semiconductor, RIE using a CF-based gas such as CF$_4$, CHF$_3$, CH$_2$F$_2$, or C$_4$F$_6$, O$_2$, or the like as an etchant gas is applied. In such a circumstance, a material of the embodiment is used for an etch mask. Therefore, high resistance to RIE using the gas is desired.

The etching mechanism of RIE consists of etching by a chemical reaction (chemical etching), etching by physical sputtering (physical etching), deposition of a protective film, and the like as components. By these components, the etch rate is determined. General RIE has a strong influence by the component of chemical etching, but at a high bias region, the component of physical etching cannot be ignored. Suppose etching by a chemical reaction. Most metallic compounds are highly resistant to O$_2$ RIE, and therefore the infiltration of the resin with a metallic compound enhances O$_2$ RIE resistance. On the other hand, resistance to RIE using a CF-based gas is complex. In a case of RIE using a CF-based gas, resistance to an F ion or radical needs to be enhanced. At the end, it is necessary that a fluoride be not released from a system by heat.

When RIE using a CF-based gas is processed, a metallic element may form a fluoride with a F element. When the boiling point of this fluoride is lower than room temperature, the fluoride volatilizes. For example, when the metallic element is Si, the boiling point of a fluoride thereof is −65° C., therefore etching based on RIE using a CF-based gas is possible. For a fluoride of a general metal with a low boiling point, which is not lower than the fluoride of Si, a chemical reaction is likely to proceed, and etching is likely to proceed. As a limitation of selecting a metal with which the resin is infiltrated, the boiling point of a fluoride of the metal is considered. A metal forming a fluoride with a high boiling point is preferred. In a case of a metal that forms a plurality of fluorides, the limitation is based on a fluoride with the lowest boiling point.

For example, $CaF_2$, $SrF_2$, $SmF_2$, $LaF_3$, $CeF_3$, $PrF_3$, $EuF_3$, $MgF_2$, $YF_3$, $HoF_3$, $ErF_3$, $YbF_3$, $TmF_3$, $BaF_2$, and $MnF_2$ all have a boiling point of 2,000° C. or higher. $CdF_2$, $NaF$, $LiF$, $ThF_4$, $NiF_2$, $ScF_3$, $CuF_2$, $KF$, and $ZnF_2$ all have a boiling point of 1,500° C. or higher. $CrF_3$, $RbF$, $BeF_2$, $FeF_3$, $CoF_3$, $PbF_4$, $AlF_3$, $CsF$, $RhF_3$, $PdF_2$, $InF_3$, and $AgF$ all have a boiling point of 1,000° C. or higher. $GaF_3$, $SnF_4$, $HgF_2$, $ZrF_4$, and $BiF_3$ all have a boiling point of 500° C. or higher. When these metallic elements are used as the metal with which the resin is infiltrated, etching by a chemical reaction of a fluoride of the metal with which the resin is infiltrated can be reduced. Therefore, these metals are candidates of the metal M with which the resin is infiltrated.

RIE includes an etching mode by physical sputtering in which a high bias is applied to accelerate ions, as described above. From the viewpoint of molecular theory, this mode is a phenomenon in which a bond between a fluorinated metal and fluorine is dissociated by bombarding ions or atoms for sputtering. The fluorinated metal is sputtered away. It is known that the etching (sputtering) rate at that time is the reciprocal of binding energy between atoms. Therefore, it is preferable that the binding energy between the metal, with which the resin is infiltrated, and F atoms is higher. infiltrat For example, all the binding energies between B, Al, La, Th, and Hf and fluorine are 600 kJ/mol or more. All the binding energies between Sc, Gd, Ga, Ce, Pr, Li, Si, Be, Ta, Sm, Er, Tb, Nd, Eu, Ho, Sr, Pu, Dy, Ca, Cr, Ge, Cs, In, and C and fluorine are 500 kJ/mol or more. All the binding energies between Rb, K, Na, Sn, Mo, Mg, Fe, Mn, Ni, Sb, Co, Np, Cu, As, P, Lu, and Ru and fluorine are 400 kJ/mol or more. When the resin is infiltrated with these metallic elements, physical sputtering of the metals with which the resin is infiltrated can be reduced. Therefore, these metals are candidates of the metal M with which the resin is infiltrated.

Examples of a metallic element capable of reducing both a chemical reaction and physical sputtering include at least one metal selected from the group consisting of Li, Be, Na, Mg, Al, K, Ca, Sc, Cr, Mn, Fe, Co, Ni, Cu, Ga, Rb, Sr, In, Sn, Cs, La, Ce, Pr, Sm, Eu, Ho, Er, and Th.

The reactivity of the organometallic compound that is a precursor for infiltration of the resin with the metal is also important since the metallic element needs to remain in a fluoride form in the resin. In the method for manufacturing a metal fluoride-containing organic polymer metal of the embodiment, a metallic element in which a fluoride thereof is chemically more stable than an oxide thereof is preferred. This is because the metal oxide is easily converted into the metal fluoride. Examples of a metallic element in which the binding energy between the metal and fluorine atoms is higher than the binding energy between the metal and oxygen atoms include Li, Be, Na, Mg, Al, K, Ca, Cr, Mn, Fe, Co, Ni, Cu, Ga, Br, Rb, Sr, Ag, Cd, In, Sb, I, Cs, Eu, and Au.

In a structure of a ligand of the organometallic compound that is a precursor, an element at a contact point on a ligand side that forms the ligand with a metal is often a carbon or nitrogen atom. In the method of the embodiment, a process in which a metal oxide is once formed and then converted into a metal fluoride is more effective as described in detail below. In this case, it is necessary that the organometallic compound that is a precursor be oxidized. Therefore, a metal in which a bond between an oxygen and metal atoms is stronger than a bond between a carbon or nitrogen atom and the metal atom is desirable. When the element at the contact point on the ligand side is a carbon atom, it is desirable that the binding energy between oxygen and metal atoms be higher than the binding energy between carbon and metal atoms. Examples of such a metallic element include Al, Sc, Ti, V, Fe, Ni, Ga, Ge, Y, Zr, Nb, Mo, In, La, Ce, Hf, Th, and U. When the element at the contact point on the ligand side is a nitrogen atom, it is desirable that the binding energy between oxygen and metal atoms be higher than the binding energy between nitrogen and metal atoms. Examples of such a metallic element include Al, Sc, Ti, V, Cr, Y, Zr, I, Xe, La, Ce, Hf, W, Pt, Th, U, and Pu.

Among the candidates of the metal M with which the resin is infiltrated as described above, it is preferable that the metal M be selected according to characteristics required for the etch mask 3. Since the element at the contact point on the ligand side may not continuously or simultaneously react, a condition in selection of the metal M for a precursor is not limited as long as it corresponds to a condition in the case where the element is carbon or nitrogen. The aforementioned binding energies are described in CRC handbook 100th, Edition, CRC press 2019, 9-73 Bond Dissociation Energy, and the like.

When the organometallic compound 6 present in the organic polymer film 5X is exposed to the hydrogen fluoride (HF) 7 at a high temperature for fluorination, a base material that is an underlayer of the organic polymer film 5X may be corroded. Therefore, it is preferable that the exposure of the organic polymer film 5X to HF be performed at a relatively low temperature, for example, a temperature range of 0° C. to 200° C., and a relatively high pressure, for example, 60 Pa to 5,000 Pa.

When the metal M is present in a form of a metal fluoride ($MF_x$) in the organic polymer film 5Y as described above, the resistance to a F ion or F radical of the organic polymer film 5Y can be enhanced. Therefore, the resistance to etching using a CF-based gas can be improved. As described above, RIE consists of etching by a chemical reaction and etching by physical sputtering. In terms of improving the etch resistance of the organic polymer film 5Y, it is especially important to prevent etching of the organic polymer film 5Y by a chemical reaction. Regarding this point, the etching of the organic polymer film 5Y by a chemical reaction can be reduced by applying the aforementioned condition.

On the other hand, the resistance to etching by physical sputtering of the organic polymer film 5Y can be tolerated to some extent. Therefore, release of fluorine from the organic polymer film 5Y by physical sputtering can be tolerated. Thus, when fluorine is supplied from a wall surface of a hole pattern and the like formed on the organic polymer film 5Y, etching of the film to be processed can be promoted. For example, in a case of a hole pattern having a high aspect ratio and the like, a fluorine-containing etchant reaching to the bottom of a hole is reduced, and therefore etching of the film to be processed is reduced. When fluorine is supplied from the organic polymer film 5Y as the etch mask 3, the etch efficiency of the film to be processed can be increased even in etch process of the film to be processed via the hole pattern having a high aspect ratio.

Figure 3A:
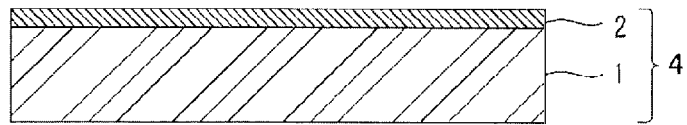
FIGS. 3A to 3E are views illustrating a second example of the steps of forming a metal fluoride-containing organic polymer film of the embodiment.
Figure 3B:
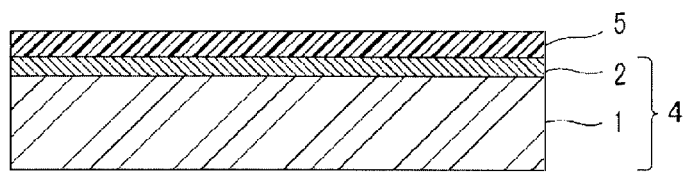
Figure 3C:
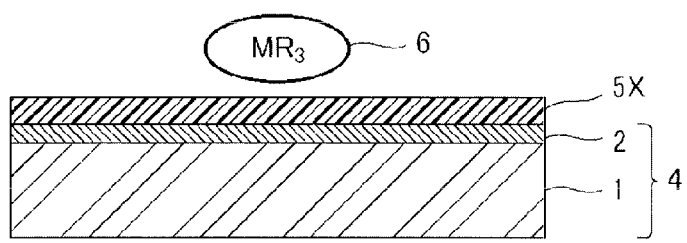
Figure 3D:
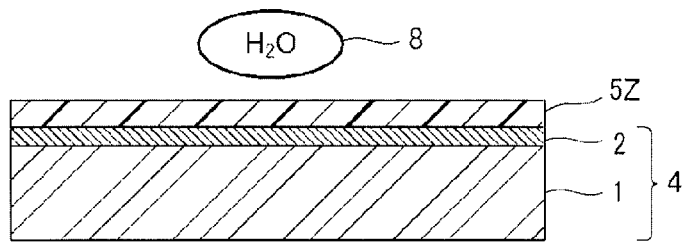

Next, a second example of the steps of manufacturing the metal fluoride-containing organic polymer film as an etch mask will be described in detail with reference to FIGS. 3A to 3E. The same steps as the steps illustrated in FIGS. 2A to 2C are first performed, and the organic polymer film 5 is exposed to the organometallic compound 6 that is the precursor of the metal M, to form the organic polymer film 5X infiltrated with the organometallic compound 6, as illustrated in FIG. 3C. As illustrated in FIG. 3D, the organic polymer film 5X infiltrated with the organometallic compound 6 is exposed to an atmosphere containing an oxidizing substance 8 such as water vapor ($H_2O$), ozone ($O_3$), and oxygen plasma, to oxidize the organometallic compound 6 such as $M(CH_3)_x$ present in the organic polymer film 5X. Thus, at least one of an oxide or a hydroxide of the metal M is produced. That is, the organic polymer film 5X is exposed to the oxidizing substance 8, to oxidize the organometallic compound 6 such as $M(CH_3)_x$ according to the following formula (2).

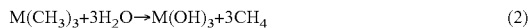

$$M(CH_3)_3 + 3H_2O \rightarrow M(OH)_3 + 3CH_4 \quad (2)$$

Figure 3E:
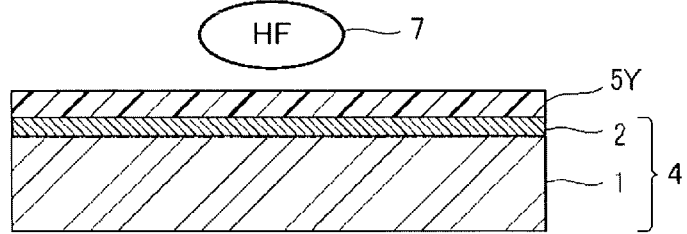

Next, an organic polymer film 5Z containing at least one of the oxide or hydroxide of the metal M is exposed to hydrogen fluoride (HF) 7, as illustrated in FIG. 3E. By the exposure of the organic polymer film 5Z to the HF 7, a metal fluoride ($MF_x$) is produced according to the following formula (3).

$$M(OH)_3 + 3HF \rightarrow MF_3 + 3H_2O \quad (3)$$

The degree of conversion in the reactions represented by the aforementioned formulae (2) and (3) is higher than the degree of conversion in the reaction represented by the aforementioned formula (1). Therefore, by a two-step reaction including an oxidation reaction of the organometallic compound 6 and a fluorination reaction of the oxide, the metal fluoride ($MF_x$) can be efficiently produced in the organic polymer film 5Y. That is, the amount of the metal fluoride ($MF_x$) produced in the organic polymer film 5Y can be increased. Thus, the etch resistance of the organic polymer film 5Y can be further improved. In addition, the use of the two-step reaction can increase the selection of reaction temperature, which makes it possible to correspond to many organic polymers.

It is preferable that the exposure of the organic polymer film 5 to the organometallic compound 6 be performed under the same condition as the condition in the first example. Further, it is preferable that the oxidizing substance 8 be introduced at a pressure of 5 kPa or less, resulting in oxidation of the organic polymer film 5 exposed to the organometallic compound 6. Furthermore, it is preferable that after the oxidation of the organometallic compound 6, the HF 7 be introduced at a pressure of 5 kPa or less, resulting in fluorination. By the exposure to the organometallic compound 6, the oxidizing substance 8, and the HF 7 under such conditions, the infiltration of the organic polymer film 5 with the organometallic compound 6, the oxidation of the organometallic compound 6, and the fluorination of the organometallic compound 6 can be efficiently achieved.

Figure 5:
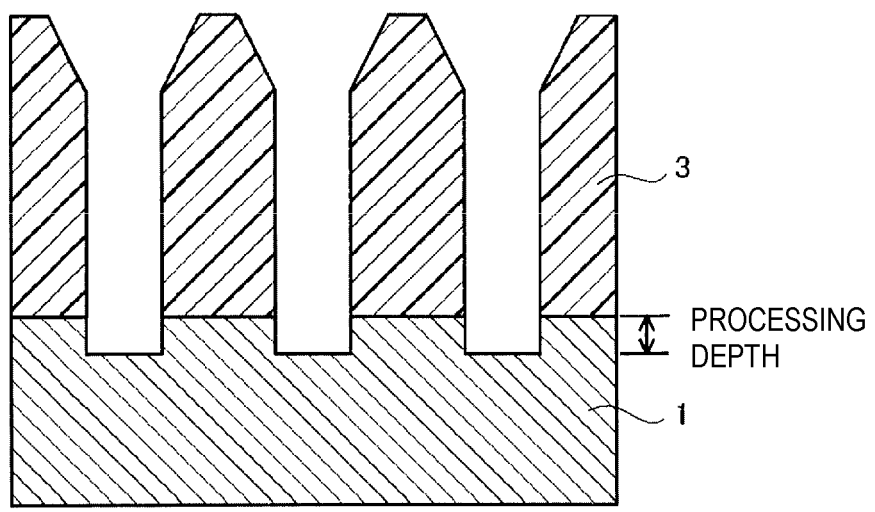
FIG. 5 is a schematic view of a shape when a base material is etched using an organic polymer film having a pattern of the embodiment as a mask.

FIG. 5 is a schematic view after a pattern is formed on the organic polymer film 3 and the Si substrate 1 that is an underlayer is etched by an etching gas containing a mixture of $C_4F_6$, $O_2$, and $N_2$ using the pattern as a mask. In Table 1, (A1) shows the etching depth of the Si substrate when the Si substrate is etched using a polymer A that is not metallized as a mask, (A2) shows the etching depth of the Si substrate when the Si substrate is etched using a polymer A that is metallized and oxidized as a mask, and (A3) shows the etching depth of the Si substrate when the Si substrate is etched using a polymer A that is metallized, oxidized, and fluorinated as a mask. (B1) shows the etching depth of the Si substrate when the Si substrate is etched using a polymer B that is not metallized as a mask, (B2) shows the etching depth of the Si substrate when the Si substrate is etched using a polymer B that is metallized and oxidized as a mask, and (B3) shows the etching depth of the Si substrate when the Si substrate is etched using a polymer B that is metallized, oxidized, and fluorinated as a mask.

As obvious from a comparison of (A1) with (A3) in Table 1, the etching depth (A3) of Si using the polymer A that is metallized, oxidized, and fluorinated is larger than the etching depth (A1) of Si using the polymer A that is not metallized. As seen from a comparison of (A2) with (A3), the etching depth (A3) of Si using the polymer A that is metallized, oxidized, and fluorinated is larger than the etching depth (A2) of Si using the polymer A that is metallized and oxidized. From comparisons of (B1), (B2), and (B3), the same findings are obtained.

TABLE 1

| | Etching depth (nm) | | |
|---|---|---|---|
| Polymer species | Non-treated (A1) and (B1) | Only oxidized (A2) and (B2) | Oxidized and fluorinated (A3) and (B3) |
| Polymer A | 29 | 34 | 69 |
| Polymer B | 45 | 71 | 85 |

Figure 4A:
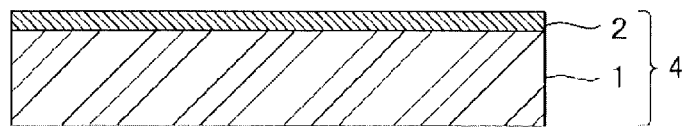
FIGS. 4A to 4E are views illustrating a third example of the steps of forming a metal fluoride-containing organic polymer film of the embodiment.
Figure 4B:
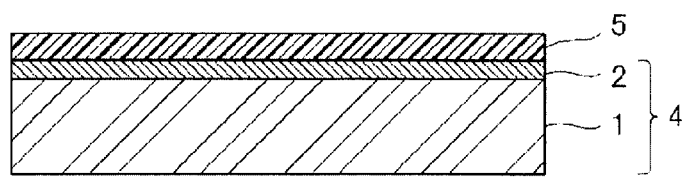
Figure 4C:
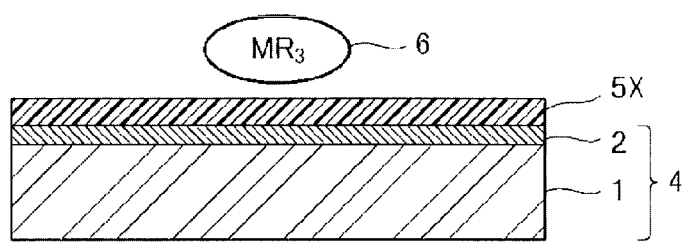
Figure 4D:
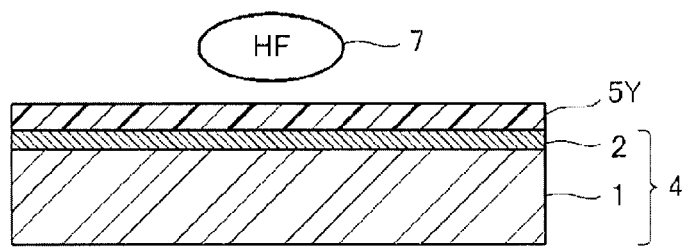

Next, a third example of the steps of manufacturing the metal fluoride-containing organic polymer film as the etch mask 3 will be described in detail with reference to FIGS. 4A to 4E. The same steps as the steps illustrated in FIGS. 2A to 2C are first performed, and a first organic polymer film 5 is exposed to the organometallic compound 6 that is the precursor of the metal M, to form a first organic polymer film 5X infiltrated with the organometallic compound 6, as illustrated in FIG. 4C. Subsequently, the first organic polymer film 5X infiltrated with the organometallic compound 6 is exposed to hydrogen fluoride (HF) 7, to fluorinate the organometallic compound 6, as illustrated in FIG. 4D. Thus, a metal fluoride ($MF_x$) is produced. These steps are performed under the same condition as the condition in the first example.

Figure 4E:
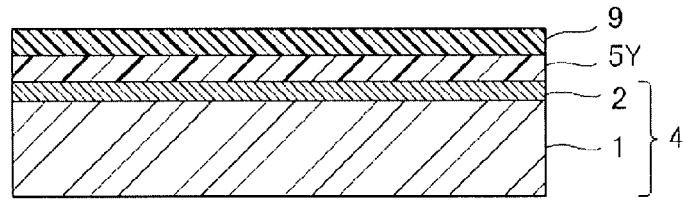

As illustrated in FIG. 4E, a second organic polymer film 9 is formed on the first organic polymer film 5Y containing the metal fluoride ($MF_x$) obtained by fluorinating the organometallic compound 6. A material for the second organic polymer film 9 may be an organic polymer that is the same as or different from the organic polymer of the first organic polymer film 5. When the second organic polymer film 9 is thus formed on the first organic polymer film 5Y, faceting occurring during exposure of the first organic polymer film 5Y to an etchant, that is, etching at a corner on an opened portion side of the first organic polymer film 5Y can be prevented by the second organic polymer film 9. When the second organic polymer film 9 does not swell into the first organic polymer film 5Y, and the second organic polymer film 9 is not metallized, a stacked film including the first organic polymer film 5 and the second organic polymer film 9 may be exposed to the organometallic compound 6 and then exposed to the HF 7.

Figure 1B:
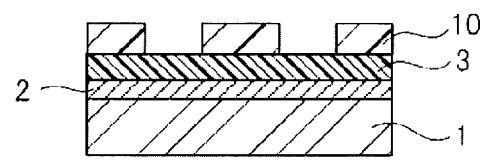

In the step of forming the etch mask 3 on the film 2 to be processed illustrated in FIGS. 1A to 1F in the patterning method illustrated in FIGS. 1A to 1F, a step of forming the aforementioned organic polymer film illustrated in FIG. 1A and a step of forming a resist pattern 10 on the organic polymer film 3 illustrated in FIG. 1B are performed. The resist pattern 10 is formed by forming a resist film on the organic polymer film 3 and patterning the resist film by lithography, an imprint technique, or the like. In the imprint technique, a resist is dropped on the organic polymer film 3, a template with a fine pattern is pressed on the resist film, and the resist film is irradiated with ultraviolet light, resulting in curing, to form the resist pattern 10.

Figure 1C:
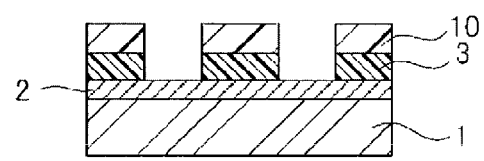
Figure 1D:
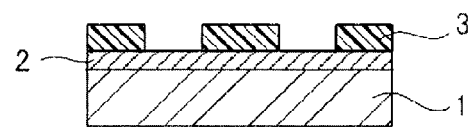
Figure 1E:
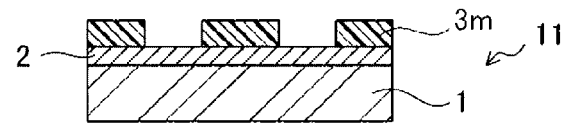

Subsequently, the organic polymer film 3 is etched by dry etching such as reactive ion etching (RIE) or ion beam etching (IBE) using the resist pattern 10 as a mask, resulting in patterning, as illustrated in FIG. 1C. FIG. 1C illustrates the patterned organic polymer film 3. When the difference in etch rate by an etching gas between the resist film and the organic polymer film 3 is small, a $SiO_x$ film and the like may be interposed between the resist film and the etch mask 3, and the organic polymer film 3 may be patterned by using the resist film and the $SiO_x$ film as masks. Next, the resist pattern 10 is removed as illustrated in FIG. 1D. Subsequently, a step of infiltrating the organic polymer film 3 patterned as described above with the organometallic compound (M compound), a step of fluorinating the organic polymer film 3 infiltrated with the metal M, and if necessary, an oxidation step and a fluorination step are performed, to obtain an etch mask 3m containing a metal fluoride, as illustrated in FIG. 1E. By these steps, a structure (patterned body) 11 having the patterned etch mask 3m on the film 2 to be processed is obtained.

Figure 1F:
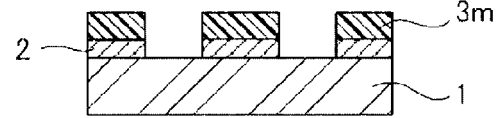

As illustrated in FIG. 1F, the patterned body 11 is used in patterning of the film 2 to be processed. Specifically, the film 2 to be processed is exposed to an etching gas via the patterned etch mask 3, to achieve dry etching. Thus, the patterned film 2 to be processed is obtained. In the dry etching, for example, RIE, IBE, and the like are applied. As the etching gas, a gas containing a fluorine atom (F) is used. It is preferable that the etching gas contain fluorine (F) in a form of fluorocarbon having 1 to 6 carbon atoms ($C_nF_{2n+2}$, $C_nF_{2n}$, or $C_nF_{2n-2}$ wherein n is a number of 1 to 6). It is preferable that the etching gas further contain oxygen ($O_2$). In an etching gas containing a fluorine atom (F) and an oxygen atom (O), it is preferable that the amount of F be larger than the amount of O, rather than the ratio by atom of F to O of 1:1. Argon (Ar) and nitrogen ($N_2$) may be added, if necessary.

When the film 2 to be processed that is patterned using such an etching gas containing a fluorine atom (F) is formed, an enhancement in etch resistance to a F radical and the like of the etch mask 3 is desired. The organic polymer film 5Y containing the metal fluoride formed by the method for manufacturing a metal fluoride-containing organic polymer film of the embodiment in response to the demand has excellent etch resistance to a F ion or F radical and the like. Therefore, the organic polymer film 5Y is suitable for a mask of dry etching such as RIE. Accordingly, the precision of the steps of the patterning method illustrated in FIGS. 1A to 1F and the subsequent etching step can be improved.

Method for Manufacturing Semiconductor Device

Figure 6A:
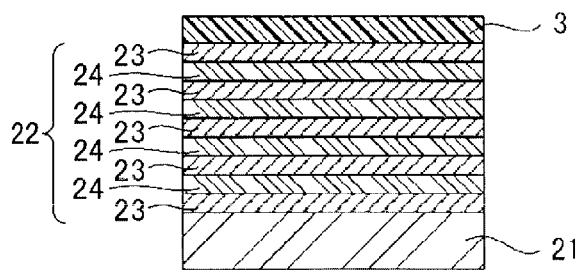
FIGS. 6A to 6E are views illustrating steps of a method for manufacturing a semiconductor device of the embodiment.

Next, a method for manufacturing a semiconductor device of the embodiment will be described with reference to FIGS. 6A to 6E. FIGS. 6A to 6E are cross-sectional views illustrating steps of the method for manufacturing a semiconductor device of the embodiment. In the method for manufacturing a semiconductor substrate illustrated in FIGS. 6A to 6E, a film 22 to be processed is formed on a semiconductor substrate 21 as illustrated in FIG. 6A. For example, the film 22 to be processed is a stacked film including a silicon nitride film 23 and a silicon oxide film 24 alternately stacked. For example, the stacked film 22 is used in manufacture of a three-dimensional stacked nonvolatile memory device having a memory cell with a vertical transistor structure. On the film 22 to be processed that is such a stacked film, the etch mask 3 is formed by the steps of the patterning method of the embodiment. The etch mask 3 is the same as the etch mask used in the steps of the patterning method of the embodiment. The film 22 to be processed is not limited to the stacked film including the silicon nitride film 23 and the silicon oxide film 24, and may be a single film of a silicon oxide film or a silicon nitride film.

Figure 6B:
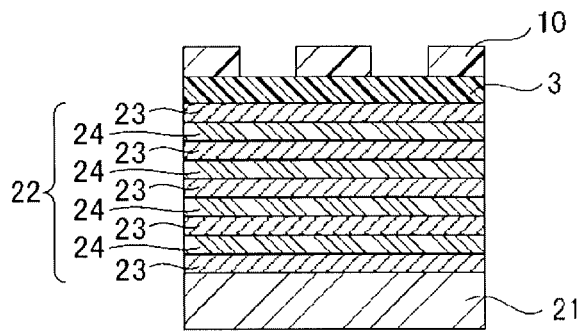
Figure 6C:
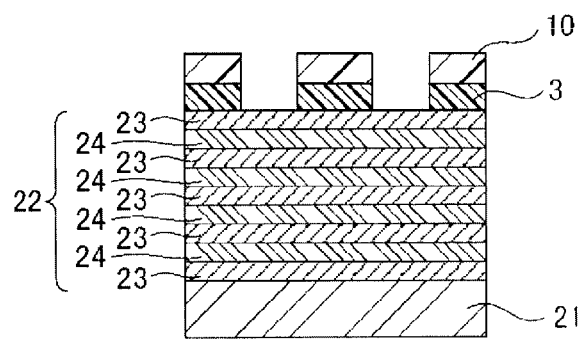
Figure 6D:
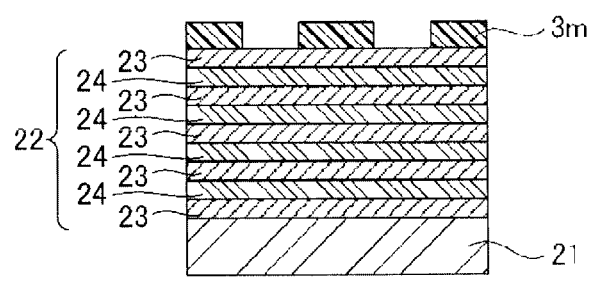

As illustrated in FIG. 6B, the resist pattern 10 is then formed on the etch mask 3. The resist pattern 10 is formed by patterning a resist film formed on the etch mask 3 by lithography, an imprint technique, or the like, in the same manner as in the steps of the patterning method of the embodiment. As illustrated in FIG. 6C, the etch mask 3 is then etched by dry etching using the resist pattern 10 as a mask, resulting in patterning. As illustrated in FIG. 6D, the resist pattern 10 is removed, a step of infiltrating the organic polymer film 3 patterned with the organometallic compound (M compound), a step of fluorinating the organic polymer film 3 infiltrated with the metal M, and if necessary, an oxidation step and a fluorination step are performed, to obtain the etch mask 3m containing a metal fluoride. The film 22 to be processed is exposed to an etching gas via the patterned etch mask 3m, to achieve dry etching. By such dry etching, the patterned film 22 to be processed is obtained as illustrated in FIG. 6E.

For the dry etching, RIE, IBE, and the like are applied. As the etching gas, a gas containing a fluorine atom (F) is used. It is preferable that the etching gas contain a fluorine atom (F) in a form of fluorocarbon having 1 to 6 carbon atoms ($C_nF_{2n+2}$, $C_nF_{2n}$, or $C_nF_{2n-2}$ wherein n is a number of 1 to 6). It is preferable that the etching gas further contain an oxygen gas ($O_2$). In an etching gas containing a fluorine atom (F) and an oxygen atom (O), it is preferable that the amount of F be larger than the amount of O, rather than the ratio by atom of F to O of 1:1. By using such an etching gas containing fluorocarbon and the like, the film 22 to be processed such as the aforementioned stacked film can be effectively etched.

When as described in the patterning method of the embodiment, the etch mask 3 formed in the particular steps from the particular materials is used, high etch resistance can be achieved even in dry etching of the film 22 to be processed, using the etching gas containing fluorocarbon and the like. Even when a pattern having a hole with a high aspect ratio is formed like the film 22 to be processed illustrated in FIGS. 6A to 6E, the patterning precision of the film 22 to be processed can be enhanced. Thus, the precision of formation of a semiconductor device, the yield of manufacture of a semiconductor device, and the like can be improved. In the method for manufacturing a semiconductor device of the embodiment, the film 22 to be processed is not limited to the aforementioned stacked film, and a various types of films may be used.

Figure 6E:
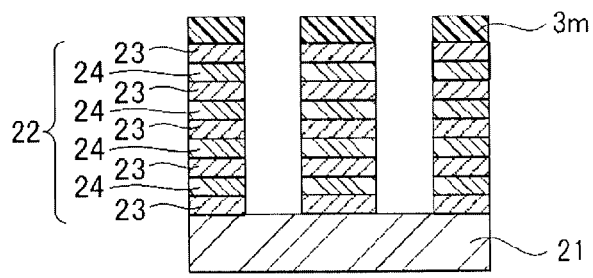

For example, the film 22 to be processed that is patterned as illustrated in FIG. 6E is used in manufacture of a memory cell array by a known method. For example, a hole pattern (memory hole) is formed in the stacked film by the aforementioned processing. In such a memory hole, a block insulating layer, a charge trapping layer, a tunnel insulating layer, a channel layer, and a core layer are formed in order. Further, only a nitride film in the stacked film is removed via a slit formed separately from the memory hole, and a formed space is filled with a conductive film. As a result, a stacked film in which the insulating film (oxide film) and the conductive film are alternately stacked is obtained. Thus, a memory cell structure with a vertical transistor structure can be formed. The conductive film in the stacked film can function as a word line.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method for manufacturing a metal fluoride-containing organic polymer film comprising:
    forming an organic polymer film on a base body;
    exposing the organic polymer film to an organometallic compound containing a first metal, thereby infiltrating the organic polymer film with the organometallic compound;
    exposing the organic polymer film infiltrated with the organometallic compound to hydrogen fluoride, thereby providing a fluoride of the first metal in the organic polymer film; and
    forming a second organic polymer film on the organic polymer film containing the fluoride of the first metal.

2. The method for manufacturing a metal fluoride-containing organic polymer film according to claim 1, further comprising:
    housing the organic polymer film in a vacuum atmosphere of 1 kPa or less, and then exposing to the organometallic compound at a pressure of 5 kPa or less; and
    exposing the organic polymer film infiltrated with the organometallic compound to hydrogen fluoride at a pressure of 5 kPa or less.

3. The method for manufacturing a metal fluoride-containing organic polymer film according to claim 1, further comprising:
    exposing the organic polymer film infiltrated with the organometallic compound to water vapor, ozone, or oxygen plasma, thereby providing at least one selected from an oxide or a hydroxide of the first metal in the organic polymer film; and
    exposing the organic polymer film containing at least one selected from the oxide or hydroxide of the first metal to the hydrogen fluoride.

4. The method for manufacturing a metal fluoride-containing organic polymer film according to claim 1,
    wherein the first metal contains at least one selected from the group consisting of aluminum, boron, lanthanum, thorium, hafnium, titanium, zirconium, scandium, gadolinium, gallium, cerium, praseodymium, yttrium, lithium, silicon, beryllium, tantalum, vanadium, niobium, samarium, erbium, terbium, neodymium, europium, holmium, strontium, plutonium, dysprosium, calcium, chromium, germanium, cesium, indium, carbon, rubidium, potassium, sodium, tin, molybdenum, magnesium, iron, manganese, nickel, antimony, cobalt, *neptunium*, copper, silver, gold, platinum, arsenic, phosphorus, lutetium, bromine, iodine, and ruthenium.

5. The method for manufacturing a metal fluoride-containing organic polymer film according to claim 1,
    wherein the organometallic compound is an alkyl metal.

6. A patterning method comprising:
    forming a pattern on an organic polymer film formed on a film;
    exposing the organic polymer film having the pattern to an organometallic compound containing a first metal, thereby infiltrating the organic polymer film with the organometallic compound;
    exposing the organic polymer film infiltrated with the organometallic compound to hydrogen fluoride; and
    forming a second organic polymer film on the organic polymer film containing the fluoride of the first metal.

7. The patterning method according to claim 6, further comprising:
    exposing the organic polymer film infiltrated with the organometallic compound to water vapor, ozone, or oxygen plasma, thereby producing at least one selected from an oxide or a hydroxide of the first metal in the organic polymer film, and
    exposing the organic polymer film containing at least one selected from the oxide or hydroxide of the first metal to the hydrogen fluoride.

8. The patterning method according to claim 6,
    wherein the first metal contains at least one selected from the group consisting of aluminum, boron, lanthanum, thorium, hafnium, titanium, zirconium, scandium, gadolinium, gallium, cerium, praseodymium, yttrium, lithium, silicon, beryllium, tantalum, vanadium, niobium, samarium, erbium, terbium, neodymium, europium, holmium, strontium, plutonium, dysprosium, calcium, chromium, germanium, cesium, indium, carbon, rubidium, potassium, sodium, tin, molybdenum, magnesium, iron, manganese, nickel, antimony, cobalt, *neptunium*, copper, silver, gold, platinum, arsenic, phosphorus, lutetium, bromine, iodine, and ruthenium.

9. The patterning method according to claim 6,
    wherein the organometallic compound is an alkyl metal.

10. A method for manufacturing a semiconductor device comprising:
    forming an organic polymer film on a semiconductor substrate having a film;
    etching the organic polymer film to form a pattern;
    exposing the organic polymer film having the pattern to an organometallic compound containing a first metal, thereby infiltrating the organic polymer film with the organometallic compound;
    exposing the organic polymer film infiltrated with the organometallic compound to hydrogen fluoride;
    etching the film using the organic polymer film that is exposed to the hydrogen fluoride; and
    forming a second organic polymer film on the organic polymer film containing the fluoride of the first metal.

11. The method for manufacturing a semiconductor device according to claim 10, further comprising:
    exposing the patterned organic polymer film infiltrated with the organometallic compound to water vapor, ozone, or oxygen plasma, thereby providing at least one selected from an oxide or a hydroxide of the first metal in the organic polymer film; and
    exposing the organic polymer film containing at least one selected from the oxide or hydroxide of the first metal to the hydrogen fluoride.

12. The method for manufacturing a semiconductor device according to claim 10,
    wherein the first metal contains at least one selected from the group consisting of aluminum, boron, lanthanum, thorium, hafnium, titanium, zirconium, scandium, gadolinium, gallium, cerium, praseodymium, yttrium, lithium, silicon, beryllium, tantalum, vanadium, niobium, samarium, erbium, terbium, neodymium, europium, holmium, strontium, plutonium, dysprosium, calcium, chromium, germanium, cesium, indium, carbon, rubidium, potassium, sodium, tin, molybdenum, magnesium, iron, manganese, nickel, antimony, cobalt, *neptunium*, copper, silver, gold, platinum, arsenic, phosphorus, lutetium, bromine, iodine, and ruthenium.

13. The method for manufacturing a semiconductor device according to claim 10,
wherein the organometallic compound is an alkyl metal.

14. The method for manufacturing a semiconductor device according to claim 10,
wherein the film is a silicon oxide film or a stacked film including a silicon oxide film and a silicon nitride film.

* * * * *